(12) United States Patent  (10) Patent No.: US 8,142,966 B2
Izikson et al.  (45) Date of Patent: Mar. 27, 2012

(54) SUBSTRATE MATRIX TO DECOUPLE TOOL AND PROCESS EFFECTS

(75) Inventors: Pavel Izikson, Haifa (IL); Michael E. Adel, Zichron Yaakov (IL); Daniel Kandel, Aseret (IL)

(73) Assignee: KLA-Tenor Corporation, Milpitas, CA (US)

( * ) Notice: Subject to any disclaimer, the term of this patent is extended or adjusted under 35 U.S.C. 154(b) by 0 days.

(21) Appl. No.: 12/990,183

(22) PCT Filed: May 20, 2009

(86) PCT No.: PCT/US2009/044594
§ 371 (c)(1),
(2), (4) Date: Oct. 28, 2010

(87) PCT Pub. No.: WO2009/143200
PCT Pub. Date: Nov. 26, 2009

(65) Prior Publication Data
US 2011/0051116 A1  Mar. 3, 2011

Related U.S. Application Data

(60) Provisional application No. 61/054,897, filed on May 21, 2008.

(51) Int. Cl.
G03F 9/00 (2006.01)
H01L 21/66 (2006.01)
(52) U.S. Cl. ............................. 430/30; 257/48; 716/136
(58) Field of Classification Search .................... 430/30; 257/48; 716/136
See application file for complete search history.

(56) References Cited

U.S. PATENT DOCUMENTS

| | | | |
|---|---|---|---|
| 6,887,722 B2 * | 5/2005 | Schedel et al. | 438/7 |
| 7,381,634 B2 * | 6/2008 | Lin et al. | 438/612 |
| 7,566,650 B2 * | 7/2009 | Lin et al. | 438/613 |
| 7,747,978 B2 * | 6/2010 | Ye et al. | 716/50 |
| 7,960,078 B2 * | 6/2011 | Sawai et al. | 430/30 |
| 2004/0029027 A1 | 2/2004 | Schedel et al. | |
| 2006/0231948 A1 | 10/2006 | Lin et al. | |
| 2007/0031745 A1 | 2/2007 | Ye et al. | |
| 2007/0069346 A1 | 3/2007 | Lin et al. | |
| 2007/0298335 A1 | 12/2007 | Sawai et al. | |
| 2008/0017907 A1 | 1/2008 | Otremba | |

FOREIGN PATENT DOCUMENTS

JP 06181156 A 6/1994
KR 1020060055863 A 5/2006
* cited by examiner

*Primary Examiner* — Christopher Young
(74) *Attorney, Agent, or Firm* — Luedeka Neely Group, P.C.

(57) ABSTRACT

A method of characterizing a process by selecting the process to characterize, selecting a parameter of the process to characterize, determining values of the parameter to use in a test matrix, specifying an eccentricity for the test matrix, selecting test structures to be created in cells on a substrate, processing the substrate through the process using in each cell the value of the parameter as determined by the eccentric test matrix, measuring a property of the test structures in the cells, and developing a correlation between the parameter and the property.

20 Claims, 2 Drawing Sheets

SUBSTRATE MATRIX TO DECOUPLE TOOL AND PROCESS EFFECTS

This application claims all rights on and priority to U.S. provisional patent application 61/054,897 filed May 21, 2008. This invention relates to the field of integrated circuit fabrication. More particularly, this invention relates to correlating input parameters with output properties of a process, in a manner where confounding influences—either known or unknown—are reduced or eliminated.

FIELD

Background

The demand for ever smaller integrated circuits significantly increases the requirement for tight control over the properties of the integrated circuits, such as feature dimensions. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices. The uniformity of properties such as feature dimensions is influenced during photolithography by a number of different parameters, such as exposure and focus.

Currently, the settings for such parameters are determined by exposing test patterns in cells 12 on a test substrate 14, where the settings for each of the patterns are determined using a conventional orthogonal test matrix 10 of combinations of photolithography parameters, such as depicted in FIG. 1. FIG. 1 does not depict the actual test patterns themselves, because a variety of different test patterns could be used, and the present invention is not particularly directed towards any specific test pattern. Instead, FIG. 1 depicts the parameter settings as they would be used for processing each of the cells 12 on the substrate 14. In the example of FIG. 1, only two parameters are specified, so as to not unduly encumber the drawings. However, many different parameters might be specified in a given test matrix 10.

In the convention test matrix 10 as depicted in FIG. 1, uniform incremental shifts in exposure E are made in the cells 12 across a first dimension of the test matrix 10 on the substrate 14, such as the X dimension, and uniform incremental shifts in focus F are made in the cells 12 across a second dimension of the test matrix 10 on the substrate 14, such as the Y dimension. After processing the substrate 14, the properties of the test patterns on the substrate 14, such as how closely the dimensions of the test patterns match the desired sizes, are measured at each cell 12 of the test matrix 10 to generate correlations between the parameters of the test matrix 10 and the measured properties.

This method of measuring and analyzing test substrates 14, however, sometimes suffers from an undesirable confounding of the correlations between the parameters and the measured properties, which confounding tends to reduce the degree of accuracy in the correlation between the parameters and the properties. The source of the confounding can be extremely difficult to determine and account for.

What is needed, therefore, is a method that overcomes problems such as those described above, at least in part.

SUMMARY

The above and other needs are met by a method of characterizing a process by selecting the process to characterize, selecting a parameter of the process to characterize, determining values of the parameter to use in a test matrix, specifying an eccentricity for the test matrix, selecting test structures to be created in cells on a substrate, processing the substrate through the process using in each cell the value of the parameter as determined by the eccentric test matrix, measuring a property of the test structures in the cells, and developing a correlation between the parameter and the property.

By specifying an eccentricity for the test matrix, as defined below, the confounding effects of other, sometimes unknown variables, such as photoresist thickness, post exposure bake temperature uniformity, order of exposure during lithography, can be reduced or eliminated from the correlations that are developed between the parameters and the properties. This produces a correlation that is far more indicative of the effect of the parameters on the properties.

In various embodiments, two parameters are selected, and in some embodiments more than two parameters are selected. In some embodiments the process is a photolithographic process. In addition, in one embodiment the process is a photolithographic process, two parameters are selected, and the selected parameters are focus and exposure. In some embodiments only two values of the parameter are determined, and in other embodiments at least three values of the parameter are determined. The eccentricity in some embodiments orders the test matrix in a random order, and in other embodiments the eccentricity orders the test matrix in a pseudo-random order. Multiple parameters are selected in some embodiments, and each cell is processed with a unique combination of values of the parameters. The test structures include a line width in some embodiments. For some embodiments, more than one property is measured. The property in some embodiments includes line width. In some embodiments the correlation is a polynomial equation that correlates the parameter as an input variable to the property as an output variable. The correlation of some embodiments between the parameter and the property indicates how close the property is to a desired value of the property.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

According to the present invention, the various embodiments reduce the effects of problems such as those mentioned above by creating a test matrix 10 on a substrate 14, where the values of the parameters do not change in a uniform incremental manner across the dimensions of the text matrix 10, as they do in a convention test matrix 10. Instead, the values for the parameters appear to be scrambled or random in nature, which nature is defined as being eccentric herein, as described in more detail below.

In some embodiments, the test matrix 10 uses incrementally shifted values of a parameter in a given dimension of the matrix 10, and those values in some embodiments are uniformly incremented, but the values would appear as being more or less randomly selected as one moved from one cell 12 of the test matrix 10 to the next cell 12 across a given dimension of the matrix 10, and the incremental nature and the value of the increment would not be immediately apparent, as it would be with the convention text matrix 10.

Figure 2:
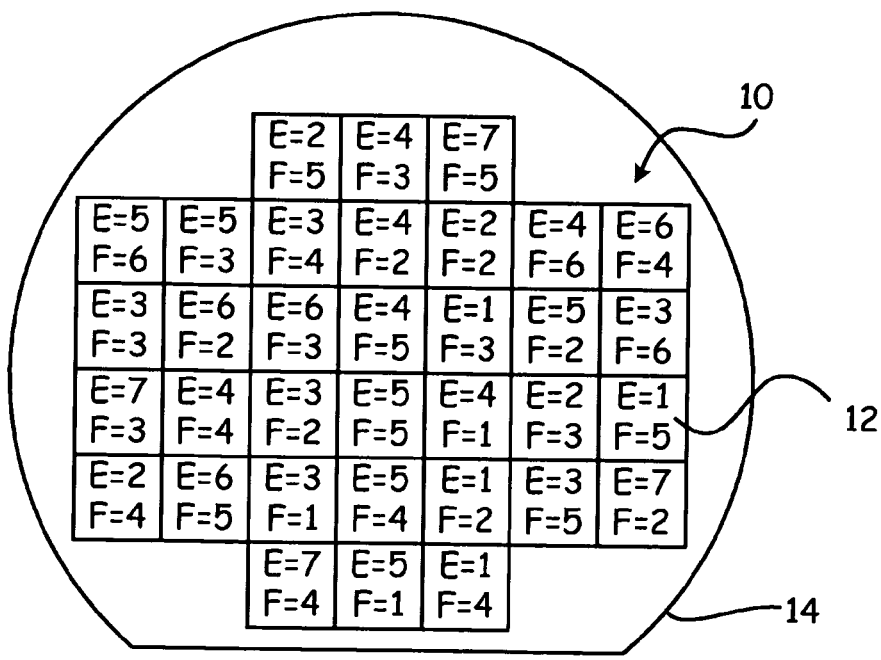
FIG. 2 depicts an eccentric test matrix for use in a method according to an embodiment of the present invention.

With reference now to FIG. 2, there is depicted a test matrix 10 for use in a method according to an embodiment of the present invention. The text matrix 10 defines the settings for at least one processing parameter, such as exposure and focus during a photolithographic process. In some embodiments, at least two variables are represented in the test matrix 10. Each of the cells 12 in the matrix represents a setting for the processing parameter, or for a combination of settings when more than one parameter is included in the evaluation. In the example depicted in FIG. 2, two processing parameters are depicted in the test matrix 10, being exposure E and focus F. Each of the cells 12 represents a combination of those two parameters. The cells 12 can have a variety of different combinations of the parameters. In some embodiments, each of the cells 12 of the test matrix 10 has a different and unique combination of the parameters. In other embodiments, some of the cells 12 of the test matrix 10 have redundant combinations. Such decisions can be made, for example, according to a statistical experimental design.

In the embodiments of the test matrix 10 according to the present invention, the values for a given parameter do not uniformly increment across the test matrix 10. For example, in the embodiment depicted in FIG. 2, the values for the focus F in the third row read, as one moves across the row from left to right, 3, 2, 3, 5, 3, 2, and 6. Thus, there is no readily discernable pattern to the value of the focus parameter as one moves across that dimension of the test matrix 10. Similarly, moving from top to bottom down the third column of cells 12 in the test matrix 10, the values of the focus parameter F read 5, 4, 3, 2, 1, and 4. Again, there is no readily discernable pattern to the value of the focus parameter as one moves down that dimension of the test matrix 10. This same condition exists for the exposure parameter E in the test matrix 10. In some embodiments, more than two parameters are represented in each cell 12, and this same eccentricity is observed in the values of all of the parameters as one moves across a given dimension of the test matrix 10.

It is noted that for any given parameter of the test matrix 10, one could possibly find a row or column where that parameter did indeed increment in a uniform manner across a given dimension in a given row or column of the test matrix 10. However, this condition would have arisen by virtue of the eccentric nature of the placement of the cells 12, and would not be applied uniformly across the test matrix 10, as is done in the prior art test matrix of FIG. 1.

Figure 1:
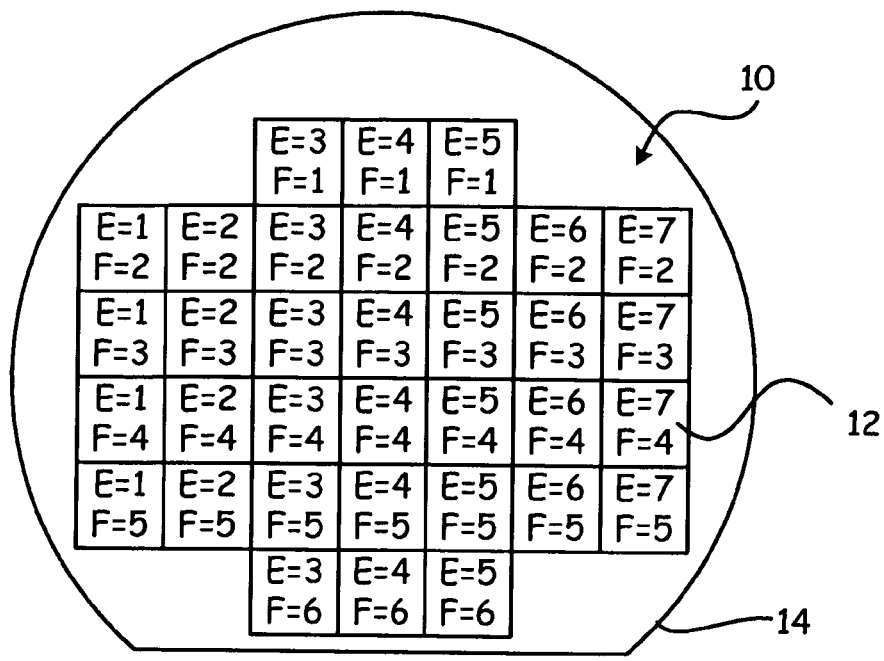
FIG. 1 depicts a conventional test matrix.

The eccentricity of the values of the parameters in the cells 12 can be determined in a number of different ways. For example, the eccentricity can be truly random, or pseudo-random, or specified according to a specific spatial pattern, or set by a mathematical algorithm. The eccentricity may also take into account the specific limitations or complexities of the particular tool on which the substrate is to be processed. For example, a particular exposure pattern on a substrate in a given exposure tool might provide advantages in terms of ease of setup, speed of exposure, or accuracy of exposure performance. For example, in one embodiment all of the cells 12 that have a given value for one of the parameters—such as a value for focus equal to 3 for example—might be placed in a given quadrant of the test matrix 10 on the substrate 14. What would not be done, however, is to uniformly increment the parameters throughout the test matrix 10, as depicted in FIG. 1. Regardless, the eccentric pattern of FIG. 2 appears shuffled when compared to the conventional pattern of FIG. 1.

After determining the settings for each of the parameters of the test matrix 10, each cell 12 of the test matrix 10 on the substrate 14 is processed according to the parameters specified for that cell 12. For example, if a given cell 12 has parameters of focus and exposure specified at values of 1 for the focus and 3 for the exposure, then that cell 12 is processed through an aligner, stepper, or other exposure tool using those process settings. All of the other cells 12 are likewise processed through the exposure tool using their specified process settings, until the entire test matrix 10 has been processed according to the settings of each of the cells 12.

Although the eccentricity of the values of the parameters may be defined according to different criteria, another aspect of some of the embodiments of the current invention is the order of exposure of the test matrix 10. In modern exposure tools, the order of exposure during a production run can be optimized for throughput or placement accuracy. This is also the case in some embodiments during exposure of the eccentric test matrix 10. For example, it might be advantageous to expose the cells 12 of the test matrix 10 in an order according to their spatial proximity, or alternately, in sequential order of exposure parameter, irrespective of location.

As mentioned above, each of the cells 12 has, in one embodiment, at least one test structure defined within it. In some embodiments each cell 12 contains identical test structures. In some embodiments a variety of different test structures are contained within each cell 12. After the substrate 14 has been processed according to the parameter values described above, various characteristics of the test structures within the cells 12 are measured. For example, the size of a given dimension of a test structure or the thickness of a specific layer such as photresist is measured in some embodiments. Other examples could be the dose of an implant, or the thickness of a deposit, for process steps other than photolithography. This information is recorded for each cell 12.

In one embodiment, a correlation is then developed between the values of the parameters (as input variables) and the values of the measured properties (as output variables). Instead of developing a correlation for the absolute value of the measured properties, in an alternate embodiment the correlation could be developed for how closely the values of the properties as measured match with the intended values for those properties. In this manner, a mathematical model of the effect of the parameters on the properties is developed. This can be used to determine desired settings for the process that is characterized in this manner.

Figure 3:
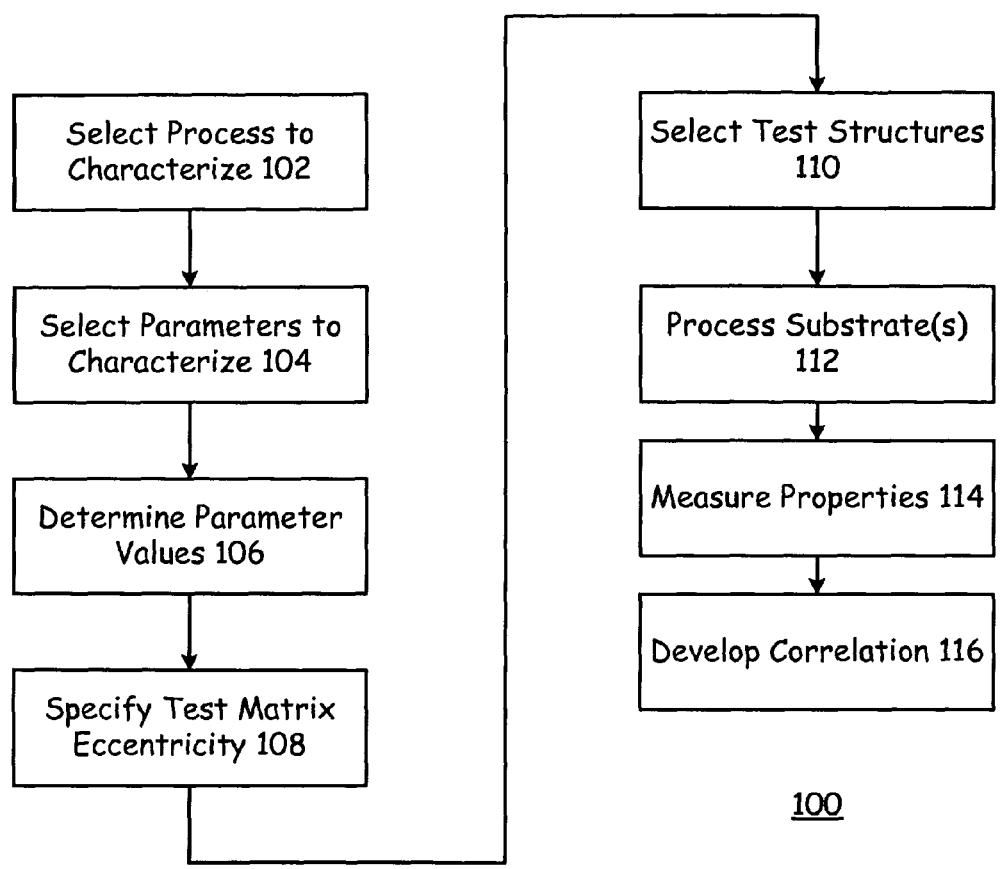
FIG. 3 depicts a flow chart for a method according to an embodiment of the present invention.

With reference now to FIG. 3, there is depicted a flow chart 100 for a method according to the present invention. The first step is to select that process that is to be characterized, as given in block 102. As described above, the process that has been used as the predominant example is that of exposing photoresist during a photolithographic process, such as with an exposure tool like a stepper or aligner. However, any number of other processes could also be characterized in this manner, such as ion implantation, etch, ashing, deposition, anneal, and so forth.

Next, the parameters to be characterized are selected, as given in block 104. These parameters would typically be inherent to the process selected for characterization. For example, the description above mentions both exposure and focus, which are photolithography parameters. Parameters for other processes could include temperature, pressure, dopant concentration, power, bias voltage, flow rate, time, and so forth. While the examples above were given in terms of only two such parameters, any number of parameters could be characterized.

The next step is to determine the parameter values, or in other words, the levels over which the parameters are to be characterized, as given in block 106. In the example above, the parameter values ranged from 1 to 6 or 7. However, those numbers were just representational, and simple values were used so as to not unduly complicate the example. In actual implementation, more complex ranges of values, and more complex steps might be employed. According to some experimental design methodologies, only three levels of a given parameter might be tested. In other experimental design methodologies, a wide variety of levels, with or without uniform incrementation, might be tested.

The next step is to specify the eccentricity of the test matrix, as given in block 108. By this it is meant, determining how to "mix up" the cells 12 so as to disrupt whatever confounding factors there might be in the process being investigated. For example, if the substrate 14 is to be held by a chuck during the process, the eccentricity might be selected so as to disrupt a confounding influence from warpage of the substrate 14 cause by the chuck. Another eccentricity might be selected so as to reduce the confounding influence of a temperature profile across the substrate. However, the eccentricity might be selected in a random or pseudo-random manner, so as to disrupt a variety of known and unknown confounding factors. After applying this step 108 of the process, the test matrix 10 would look "mixed up" like the test matrix 10 of FIG. 2, rather than ordered like the test matrix 10 of FIG. 1.

Next, some type of test structure needs to be selected, as given in block 110 of the method 100. The test structure will be defined on one or more masks or reticles, and define a physical structure that is formed on the substrate 14. The test structure or structures selected will, in some embodiments, exhibit a relationship between the parameters being characterized, and the measurable properties of the test structures. For example, if one property to be measured is line width, then the test structure in this embodiment would include a line dimension that could be affected in some manner by the different values of the process parameters, selected in blocks 104 and 106.

One or more substrates 14 are then processed, as given in block 112. As mentioned above, each cell 12 of the test matrix 10 is processed according to the values of the parameters associated with that cell 12. To carry over the example started above, in a photolithographic process, this could mean exposing each cell 12 with the focus and exposure settings as specified for each cell 12 in the test matrix 10.

Once the substrate 14 has been processed, the properties of the test structures within each cell 12 are measured, as given in block 114. In some embodiments only a single property is measured, and in other embodiments a wide variety of properties are measured. In some embodiments, the properties to be measured are not selected until after processing the substrate 14, and in other embodiments, the properties are selected in advance of that step. In some embodiments, one or more properties are measured, only to discover that no real change in property value is caused by the different parameter settings, in which case different properties, which are more dependent upon the parameters, are selected and measured.

Finally, one or more correlations between the properties and the parameters are developed, as given in block 116. In one embodiment, the correlation associates values of the parameters as input with values of the properties as output. In another embodiment, the correlation associates values of the parameters as input with the degree to which the properties as measured match up with the value of the properties as expected or desired.

Many additional steps could be performed after the correlation is developed, such as using the correlation to set process parameters for a variety of different recipes, or to extrapolate the correlation for either parameters or properties that might be difficult to either set or measure using the current processing equipment.

In some embodiments, many of the steps of the method are accomplished using specific equipment. For example, in a photolithographic process, the substrates 14 are processed using an exposure tool. In a doping process, the substrates 14 are processed using an implanter. Thus, that step is performed using a specific machine, even though the machine might be different from one embodiment to another. In addition, the processing machine will physically transform the substrate 14 as it is processed. If no physical transformation occurred, then there would be no properties to measure after processing.

Further, the properties are measured using a specific machine. When the measured property is line width, the machine might be an optical device or a physical profiler. When the property is refractive index, then the machine might be an ellipsometer. In addition, a computer (or some processing device) is used in some embodiments to develop the correlation between the parameters and the properties. Thus, the methods according to the present invention cannot be performed merely by a series of mental steps, but must of necessity include the use of specific machines.

Implementing the methods as generally exemplified herein provides a correlation between the parameters and properties of interest, which is substantially free of the confounding effects that might be inherent in a substrate 14 that is given the processing. For example, the eccentricity of the test matrix 10 will tend to remove any confounding effects that are caused by a gradual change in a given property from one side of the substrate 14 to the other, which change might be an inherent issue with the process. Using the conventional test matrix 10 of FIG. 1, such a gradual change would be confounded with a change in the value of the parameter that is incremented in that dimension. However, using the eccentric test matrix 10 of the present invention as exemplified in FIG. 2, such a confounding factor is substantially removed from the correlation that is developed between the parameter and the property.

One use for the improved correlation between the properties and parameters of interest is in the construction of an improved mathematical model used in the conversion of property information extracted from metrology data from product substrates into lithography exposure parameters such as focus and dose. This ultimately results in better process control during lithography.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of characterizing a process, the method comprising the steps of:
   selecting the process to characterize,
   selecting a parameter of the process to characterize,
   determining values of the parameter to use in a test matrix,
   specifying an eccentricity for the test matrix,
   selecting test structures to be created in cells on a substrate,
   processing the substrate through the process using in each cell the value of the parameter as determined by the eccentric test matrix,
   measuring a property of the test structures in the cells, and
   developing a correlation between the parameter and the property.

2. The method of claim 1, wherein two parameters are selected.

3. The method of claim 1, wherein more than two parameters are selected.

4. The method of claim 1, wherein the process is a photolithographic process.

5. The method of claim 1, wherein the process is a photolithographic process, two parameters are selected, and the selected parameters are focus and exposure.

6. The method of claim 1, wherein only two values of the parameter are determined.

7. The method of claim 1, wherein at least three values of the parameter are determined.

8. The method of claim 1, wherein the eccentricity orders the test matrix in a random order.

9. The method of claim 1, wherein the eccentricity orders the test matrix in a pseudo-random order.

10. The method of claim 1, wherein multiple parameters are selected and each cell is processed with a unique combination of values of the parameters.

11. The method of claim 1, wherein the test structures include a line width.

12. The method of claim 1, wherein more than one property is measured.

13. The method of claim 1, wherein the property includes line width.

14. The method of claim 1, wherein the correlation is a polynomial equation that correlates the parameter as an input variable to the property as an output variable.

15. The method of claim 1, wherein the correlation between the parameter and the property indicates how close the measured value of the property is to a desired value of the property.

16. A method of characterizing a photolithography process, the method comprising the steps of:
    determining values of focus and exposure to use in a test matrix,
    specifying one of a random and pseudo-random eccentricity for the test matrix,
    selecting a test structure having a line width to be created in cells on a substrate,
    processing the substrate through the photolithography process using in each cell a combination of values of the focus and the exposure as determined by the eccentric test matrix,
    measuring the line widths of the test structures in the cells, and
    developing a polynomial expression that correlates the focus and exposure as input variables with the line width as output variable.

17. The method of claim 16, wherein parameters in addition to focus and exposure are used in the test matrix.

18. The method of claim 16, wherein only three values of each of focus and exposure are determined.

19. The method of claim 16, wherein the correlation between the focus and exposure and the line width indicates how close the measured value of the line width is to a desired value of the line width.

20. The method of claim 16, wherein each cell is processed with a unique combination of values of focus and exposure.

* * * * *